United States Patent
Ryu et al.

(10) Patent No.: US 7,759,216 B2
(45) Date of Patent: Jul. 20, 2010

(54) METHOD FOR FORMING TRENCH ISOLATION

(75) Inventors: Sang Wook Ryu, Cheongju-si (KR); Man Ghil Han, Ulsan (KR)

(73) Assignee: Dongbu Hitek Co., Ltd., Seoul (KR)

( * ) Notice: Subject to any disclaimer, the term of this patent is extended or adjusted under 35 U.S.C. 154(b) by 123 days.

(21) Appl. No.: 11/948,791

(22) Filed: Nov. 30, 2007

(65) Prior Publication Data
US 2008/0160720 A1 Jul. 3, 2008

(30) Foreign Application Priority Data
Dec. 29, 2006 (KR) .................. 10-2006-0137298

(51) Int. Cl.
*H01L 21/76* (2006.01)
(52) U.S. Cl. .................. 438/433; 438/424; 438/404
(58) Field of Classification Search .................. 438/433, 438/434
See application file for complete search history.

(56) References Cited

U.S. PATENT DOCUMENTS

| | | | | |
|---|---|---|---|---|
| 6,001,707 A | * | 12/1999 | Lin et al. | 438/433 |
| 6,030,898 A | * | 2/2000 | Liu | 438/692 |
| 6,406,977 B2 | * | 6/2002 | Dickerson et al. | 438/424 |
| 6,746,936 B1 | * | 6/2004 | Lee | 438/445 |
| RE38,608 E | * | 10/2004 | Yu et al. | 257/497 |
| 6,924,217 B2 | * | 8/2005 | Ryu | 438/527 |
| 6,939,779 B2 | * | 9/2005 | Takahashi | 438/426 |
| 7,537,989 B2 | * | 5/2009 | Nakai et al. | 438/218 |

FOREIGN PATENT DOCUMENTS

| | | | |
|---|---|---|---|
| KR | 10-2004-0036751 | | 5/2004 |
| KR | 10-2004-0036751 A | * | 5/2004 |
| KR | 1020040036751 | | 5/2004 |
| KR | 10-2004-0055149 | | 6/2004 |
| KR | 10-2004-0056201 A | * | 6/2004 |
| KR | 1020040055149 | | 6/2004 |
| KR | 10-2005-0069200 | | 7/2005 |
| KR | 1020050069200 | | 7/2005 |

OTHER PUBLICATIONS

Machine Translation of KR 10-2004-0036751.*
Machine Translation of KR 10-2004-0056201.*

* cited by examiner

*Primary Examiner*—Charles D Garber
*Assistant Examiner*—Bryan R Junge
(74) *Attorney, Agent, or Firm*—Workman Nydegger

(57) ABSTRACT

A method for forming a trench isolation in a semiconductor device is provided. This is a novel method for rounding the top corners of trench isolations. The method ensures that rounded corner portions with a uniform shape are consistently formed regardless of the pattern densities of active areas. The method increases the reliability of semiconductor integrated circuit devices, without degrading electrical characteristics, and making it easier to achieve high integration and performance in semiconductor integrated circuit devices.

12 Claims, 3 Drawing Sheets

US 7,759,216 B2

METHOD FOR FORMING TRENCH ISOLATION

CROSS-REFERENCES AND RELATED APPLICATIONS

This application claims the benefit of Korean Patent Application No. 10-2006-0137298, filed on Dec. 29, 2006, which is hereby incorporated by reference in its entirety.

BACKGROUND OF THE INVENTION

1. Field of the Invention

The present invention relates to an integrated circuit for a semiconductor device. More specifically, the present invention relates to a method for forming an isolated trench in the integrated circuit of a semiconductor device.

2. Discussion of the Related Art

As the demand for high-performance, compact, highly integrated semiconductors has increased, technologies for isolating the individual circuits in the integrated semiconductor and reducing the gate line width of the Metal Oxide Semiconductor Field Effect Transistors (MOSFETs) have become increasingly important.

One method for isolating the individual devices within the semiconductor uses local oxidation of silicon (LOCOS) technology, wherein an oxide layer is used to separate the components, so that no electrical current is leaked from one component to another. Examples of LOCOS processes are Thin Oxide LOCOS (TOLOCOS) processes which use a very thin pad oxide layer of 50 Å thick or less to separate the components, Poly Buffered LOCUS (PBL) processes, Nitride Spacer LOCOS (NSLOCOS) processes which use a nitride layer as a spacer, Poly Spacer LOCOS (PSLOCUS) processes which use poly silicon, and Si Recessed LOCOS (SRLO-COS) processes wherein an oxide layer is grown after an etching process used to form a Si layer in a field region that is hundreds of Å thick.

Unfortunately, however, the LOCOS processes have many limitations. For example, the processes may generate "bird's beak" regions which reduce the effective size of the active region. Furthermore, difficulties in the processes due to varying topology effect the volume ratio of a field oxide layer, while difficulties controlling the electrical characteristics of devices due to thinning of field regions cause other problems. Because of these limitations, the number of processes required and cost of manufacturing the semiconductor device is increased.

Because of these limitations, another configuration, referred to as Shallow Trench Isolation (STI) is widely used for the isolating the components in integrated circuit devices of 0.25 μm or less. Such STI isolations are suitable for achieving high integration in integrated circuit semiconductor devices since they have excellent isolation characteristics and are compact in size.

An STI isolation is generally formed by sequentially forming a pad oxide layer and a pad nitride layer on a silicon substrate. Then, an exposed area of the silicon substrate is etched to form a trench. Selected parts of the pad oxide layer and the pad nitride layer are etched so as to expose top corners of the trench. Then, a dry etch process is performed in order to round the corners of the trench and a thermal oxidation process is then performed to form an oxide layer on the surface of the trench. Then, the oxide layer is deposited so as to fill the interior of the trench. Then, a Chemical Mechanical Polishing (CMP) process is performed to complete the trench isolation process.

However, one difficulty that arises during the procedure of forming the STI isolations is that the corners of the active areas formed between the field and isolation areas have angles of 90 degrees or more, meaning that the strength of electric field applied to the gate oxide layer is significantly raised at the corner areas. This degrades the electrical characteristics of the device, and may cause leakage current and dielectric breakdown. Additionally, hump phenomena may occur as the channel regions of the corner areas are more rapidly inversed causing the bulk voltage to increase beyond the threshold voltage characteristics of most transistors. Thus, the corner areas degrade the electrical characteristics and reliability of the semiconductor integrated circuit devices. In order to eliminate the corner areas, various attempts have been made to round the corner areas of trenches.

FIG. 1 is a sectional view illustrating a conventional process for forming a rounded corner portion of a trench isolation. First, an oxide layer 12 and a nitride layer 14 are coated on a semiconductor substrate 10. Then a trench mask 16 is then formed into a pattern. The oxide layer 12 and the nitride layer 14 are then dry etched using the trench mask 16 as a mask. When the silicon substrate 10 is dry etched to form a trench 15, a polymer is formed on sidewalls of the trench from etching the oxide and nitride layers 12 and 14 using a gas such as Hbr. Once the trench has been formed, any polymer formed on the sidewalls of the nitride layer 14 during the etching process is removed, using, for example, a natural processes, so as to expose an area of the silicon below the sidewall polymer. The newly exposed silicon area is etched at a later time, resulting in a rounded portion 17 along top corners of the trench 15.

One problem of using the conventional method described above, however, is that the sidewall polymer is a byproduct of the plasma dry etching, meaning that the shape of the rounded portion 17 varies depending on the density of the etching pattern. Thus, in high integrated semiconductor devices of 0.13 μm or less, the shape of the rounded portion 17 may vary significantly depending on the specific etching pattern density. Because of this variation, the difference between the electrical characteristics, such as the hump phenomena and saturation current of the isolated areas, in the narrow and wide areas of the pattern may be very large.

In the conventional technology shown in FIG. 1, it is also difficult to perform control based on Micro-Loading Effects (MLE) in order to manage the fabrication processes since an excessive amount of polymer is formed during the dry etching process.

Another process used to round the corner of the trench isolation is a rounding oxidation method. In this method, a thermal oxide layer is formed after the trench 15 is formed and the rounded corner portion is formed by removing a portion the thermal oxide layer. Unfortunately, however, this method also results in variations since relatively large rounded corners are formed in narrow active areas and relatively small rounded corners are formed in wide active areas. This problem is more serious when manufacturing highly integrated semiconductor circuit devices of 0.13 μm or less.

BRIEF SUMMARY OF THE INVENTION

Accordingly, the present invention is directed to a method for forming a trench isolation that substantially obviates one or more problems, limitations, and/or disadvantages of the related art.

An object of the present invention is to provide a novel method for rounding the top corners of trench isolations.

Another object of the present invention is to provide a method for forming a trench isolation, which ensures that rounded corner portions of a uniform shape are consistently formed regardless of the pattern densities of active areas.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description, claims, and appended drawings.

To achieve these objects and other advantages and in accordance with the purpose of the invention, one aspect of the invention is a method for forming a trench isolation. The method comprises sequentially forming a pad oxide layer and a pad nitride layer on a semiconductor substrate, coating a photoresist layer on the pad nitride layer and selectively etching the photoresist layer to form a photoresist trench pattern layer, etching the pad oxide layer and the pad nitride layer using the photoresist trench pattern layer as an etch stop layer so the semiconductor substrate is exposed in an area corresponding to an opening of the photoresist trench pattern layer, implanting nitrogen ions into the exposed area of the semiconductor substrate to form a nitrogen ion-implanted layer, extending the nitrogen ion-implanted layer toward the sides and bottom of the semiconductor substrate to form a nitride film, removing the nitride film and etching a recess in the semiconductor substrate to form a trench including a rounded corner along a top corner of the trench, and filling the trench with an oxide layer.

Another aspect of the present invention is a method for forming a trench isolation comprising sequentially forming a pad oxide layer and a pad nitride layer on a semiconductor substrate, coating a photoresist layer on the pad nitride layer and selectively etching the photoresist layer to form a photoresist trench pattern layer, etching the pad oxide layer and the pad nitride layer using the photoresist trench pattern layer as an etch stop layer so as to expose an area of the semiconductor substrate corresponding to an opening of the photoresist trench pattern, forming a buffer oxide layer on the exposed area of the semiconductor substrate, implanting nitrogen ions into the exposed area of the semiconductor substrate including the buffer oxide layer to form a nitrogen ion-implanted layer, extending the nitrogen ion-implanted layer toward the sides and bottom of the semiconductor substrate to form a nitride film, removing the buffer oxide layer and the nitride film and etching a recess in the semiconductor substrate after the nitride film is removed to form a trench with a rounded corner along a top corner of the trench, and filling the trench with an oxide layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings are included to provide a further understanding of the invention and are incorporated in and constitute a part of this application. The drawings illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 2A to 2G are sectional views illustrating a procedure for forming a trench isolation according to the present invention.

Figure 1:
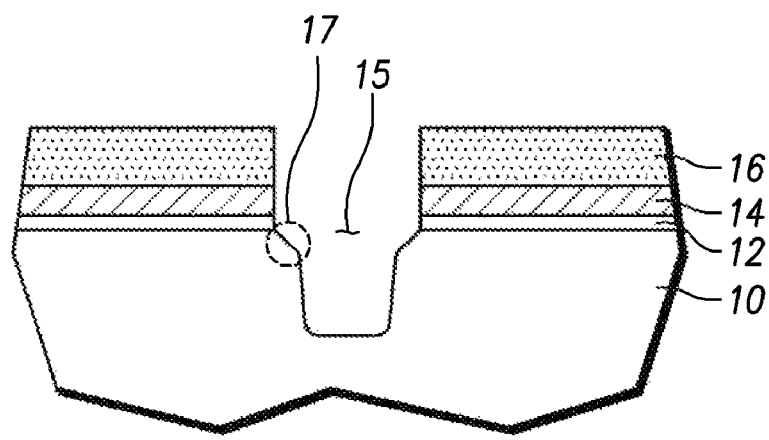
FIG. 1 is a sectional view illustrating a conventional process for forming a rounded corner portion of a trench isolation.
Figure 2A:
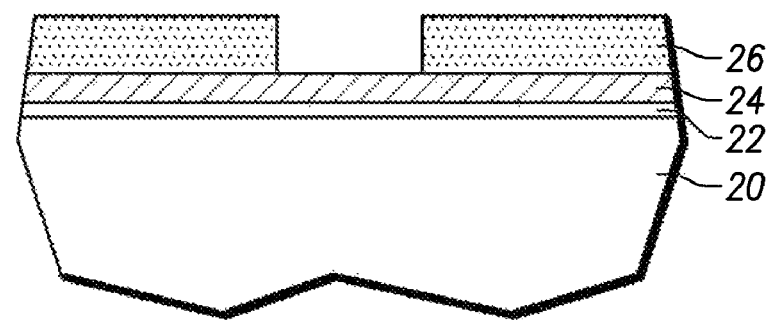
FIGS. 2A to 2G are sectional views illustrating a procedure for forming a trench isolation according to the present invention.

First, as shown in FIG. 2A, a pad oxide layer 22 and a pad nitride layer 24 are sequentially coated on a semiconductor substrate 20, followed by a photoresist layer. The photoresist layer is then selectively etched in a photolithography process to form a photoresist trench pattern layer 26.

In this example, the semiconductor substrate 20 is a silicon substrate, the pad oxide layer 22 is formed to a thickness of about 20-500 Å through a thermal oxidation process, and the pad nitride layer 24 is formed to a thickness of 300-2000 Å.

Figure 2B:
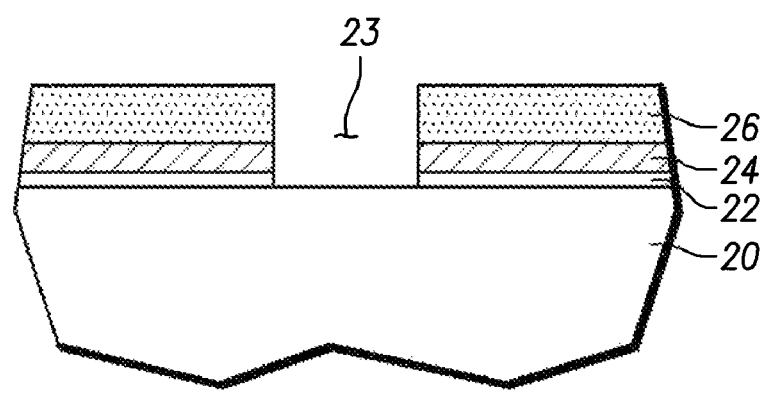

Then, as shown in FIG. 2B, a trench pattern 23 is formed by etching the pad oxide layer 22 and the pad nitride layer 24 using the photoresist trench pattern layer 26 as an etch stop layer (i.e., a mask). That is, the trench pattern 23 is formed by etching the pad oxide layer 22 and the pad nitride layer 24 so that areas of the semiconductor substrate 20 which correspond to openings of the photoresist trench pattern layer 26 are exposed.

The trench pattern 23 is formed, for example, using a dry etch method with a CF based gas and an additive gas such as $N_2$, $O_2$, and Ar.

Figure 2C:
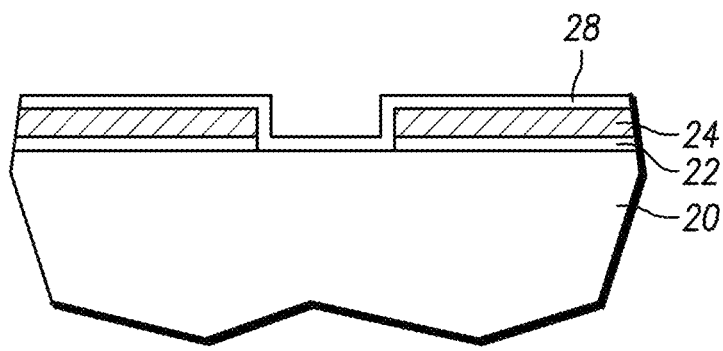

Then, as shown in FIG. 2C, after the photoresist trench pattern layer 26 is removed, a buffer oxide layer 28 is coated over the entire surface of the substrate 20 and exposed surfaces of the pad oxide layer 22 and pad nitride layer 24. The thickness of the buffer oxide layer 28 is preferably between 10 and 200 Å.

Figure 2D:
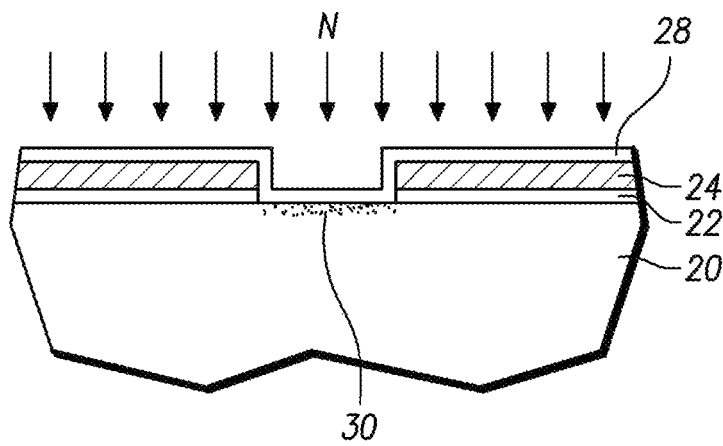

Then, as shown in FIG. 2D, nitrogen ions are implanted into the entire surface of the buffer oxide layer 28 coated thereon to form a nitrogen ion-implanted layer 30 on in the surface of the substrate that was exposed through the trench pattern 23. The nitrogen ion-implanted layer 30 extends to an area of the substrate that is immediately below the pad oxide layer 22 and adjacent to the exposed surface. To form the nitrogen ion-implanted layer 30, an ion implantation process may be performed. For example the ion implantation process may have a dose of 1E5-1E18, energy of 1 KeV-100 KeV, and an ion injection slope of 0-30 degrees.

The reason for coating the buffer oxide layer 28 before forming the nitrogen ion-implanted layer 30 is to allow the implanted nitrogen ions to be distributed evenly in the area of the substrate where the nitrogen ion-implanted layer 30 is to be formed.

Instead of nitrogen ions, nitrogen and oxygen may be implanted to form a nitrate ion-implanted layer. In this case, the term "nitrogen ion-implanted layer" used in the following description may be replaced with the term "nitrate ion-implanted layer".

In another embodiment of the present invention, a nitrogen ion-implanted layer 30 or a nitrate ion-implanted layer may be formed without forming the pad oxide layer 22. If the ion implantation process is performed without coating the pad oxide layer 22 in this manner, it is still possible to reduce the range Rp of high energy nitrogen ions.

Figure 2E:
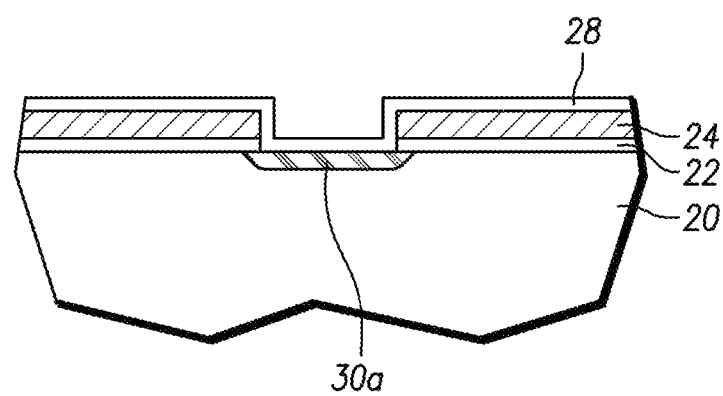

Then, as shown in FIG. 2E, a heat diffusion process or a high-speed annealing process is performed on the nitrogen ion-implanted layer 30 to form a nitride film 30a. Here, the long-time heat diffusion process may be performed at a temperature of between 500 and 900° C. for between 1 and 10 hours and the high-speed annealing process may be performed at a temperature of between 700 and 1100° C. for between 20 and 600 seconds.

As shown in FIG. 2E, the nitride film 30a is formed as the nitrogen ion-implanted layer 30 extends from the surface of the semiconductor substrate 20, which is exposed through the trench pattern 23, toward the sides and bottom of the semiconductor substrate 20. The nitride film 30a is not only formed on the exposed surface of the semiconductor substrate 20 but also extends to an area of the semiconductor substrate 20 immediately below the pad oxide layer 22 adjacent to the exposed surface.

Figure 2F:
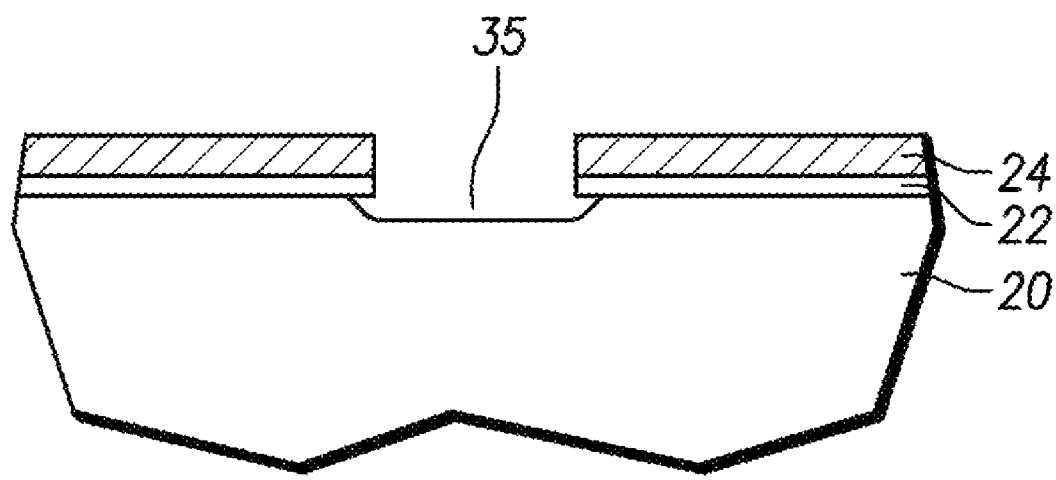

Then, as shown in FIG. 2F, the buffer oxide layer 28 and nitride film 30a are removed. The removal of the buffer oxide layer 28 is performed through a wet etching process for removing oxide layers, using an acid such as hydrofluoric acid. The nitride film 30a may be removed through a 5-200 Å wet etching process for removing nitride layers using a solution that can induce nitride layer etching, such as phosphoric acid.

If the nitride film 30a is removed from the silicon substrate 20 in this manner, then a trench pattern 35 with rounded corners is left on the surface of the silicon substrate 20.

The nitride film 30a is not only formed on the exposed surface of the semiconductor substrate 20 but also extends to the area of the semiconductor substrate 20 immediately below the pad oxide layer 22 adjacent to the exposed surface as described above. Moreover, the trench pattern 35 has rounded corners formed by removing the nitride film 30a.

Therefore, rounded corners are formed in the trench pattern 35 which extend to the area of the substrate immediately below the pad oxide layer 22.

Figure 2G:
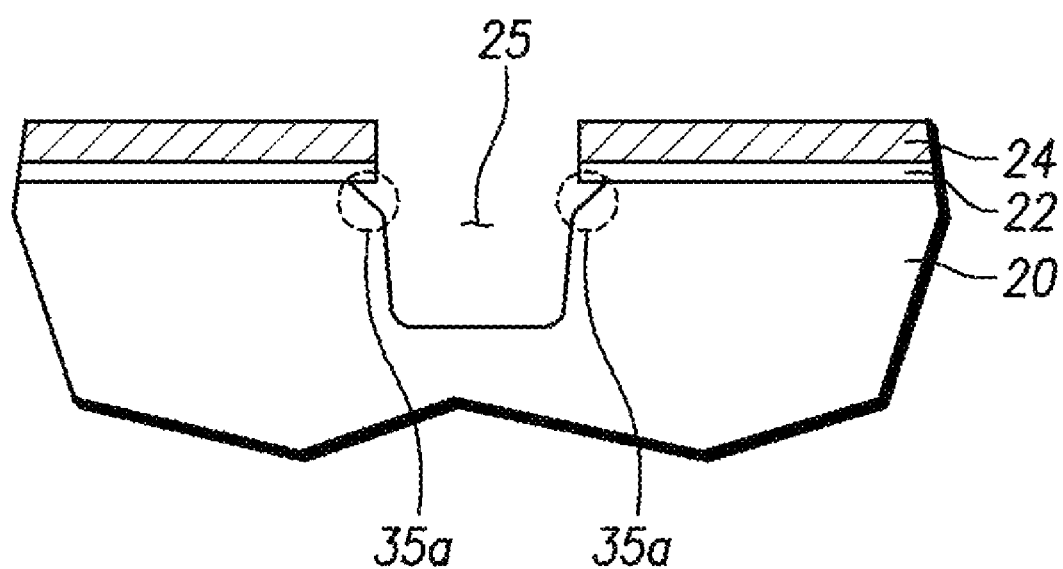

Then, as shown in FIG. 2G, the exposed area of the semiconductor substrate 20 is etched using the pad nitride layer 24 as a mask to form a trench 25. The trench 25 may be formed through an etching process using a halogen-based gas such as $Cl_2$ or HBr as a main etching gas with an additive of an inert gas such as $O_2$, $N_2$, or Ar.

When the semiconductor substrate 20 is etched to form the trench 25, a small amount (for example, 1-40 sccm) of high etch-rate gas including fluorine such as $SF_6$ and $CF_4$ may also be added to allow the rounded corner portion 35a to have a smoothly rounded shape. Here, a sidewall polymer may also be formed on sidewalls of the rounded trench pattern 35 using a gas such as HBr or $C_xH_yF_z$, where x, y, and z is 0 or a positive integer and y or z is greater than x, in order to control excessive etching of the sidewalls of the rounded trench pattern 35.

The rounded corner portions 35a with smoothly rounded shapes may also be formed using a thermal oxidation process after the dry etching for forming the trench 25.

As shown in FIG. 2G, the rounded corner portion 35a, which is gently curved, is formed along the top corners of the trench 25 using the method of the present invention, which uses a nitride film 30a that is formed through diffusion of nitrogen ions of the nitrogen ion-implanted layer 30. Accordingly, the rounded corner portion 35a has a uniform shape without being affected by the density of the etching pattern density.

Although not shown, after the trench 25 is formed on the semiconductor substrate 20, an oxide layer is coated on the semiconductor substrate 20 to fill the trench 25 and the surface of the oxide layer filled in the trench 25 is flattened through a Chemical Mechanical Polishing (CMP) process to form a trench isolation.

As apparent from the above description, the present invention provides a method for forming a trench isolation, which has a variety of features and advantages. For example, after forming a nitride or nitrate film on a surface of the substrate in a trench, rounded corner portions are formed by removing the nitride or nitrate film. This allows the formation of rounded corner portions with a uniform shape regardless of the pattern densities of active areas.

In addition, rounded corner portions of trenches are consistently formed, free from influence from the pattern densities of active areas. Because of the rounded corner portions, the electrical characteristics of the device are not degraded, thereby increasing the reliability of semiconductor integrated circuit devices. Thus, it is easy to achieve high integration and performance of semiconductor integrated circuit devices.

It will be apparent to those skilled in the art that various modifications and variations can be made in the present invention without departing from the spirit or scope of the invention. Thus, it is intended that the present invention covers any modifications and variations of this invention provided that come within the scope of the appended claims and their equivalents.

What is claimed is:

1. A method for forming a trench isolation, the method comprising:

sequentially forming a pad oxide layer and a pad nitride layer on a semiconductor substrate;

coating a photoresist layer on the pad nitride layer and selectively etching the photoresist layer to form a photoresist trench pattern layer;

etching the pad oxide layer and the pad nitride layer using the photoresist trench pattern layer as a mask so that an area of the semiconductor substrate is exposed in an area corresponding to an opening of the photoresist trench pattern layer;

forming a buffer oxide layer on the exposed area of the semiconductor substrate;

implanting nitrogen ions into the exposed area of the semiconductor substrate and the buffer oxide layer to form a nitrogen ion-implanted layer, wherein the buffer oxide layer is provided so as to allow the nitrogen ions to be distributed substantially evenly in the area of the substrate having the nitrogen ion-implanted layer;

extending the nitrogen ion-implanted layer beyond the exposed area toward both sides and bottom surface of the semiconductor substrate to form a nitride film;

removing the nitride film and buffer oxide layer, leaving a recess in the semiconductor substrate in the area where the nitride film was formed;

performing an etching process in the recess to form a trench including a top rounded corner portion; and filling the trench with an oxide layer to form a trench isolation.

2. The method according to claim 1, wherein the trench is formed by etching the recess in the semiconductor substrate using a halogen-based gas as a main etching gas with an additive of one inert gas.

3. The method according to claim 2, wherein the halogen-based gas is either $Cl_2$ or HBr and the inert gas is either $O_2$, $N_2$, or Ar.

4. The method according to claim 2, wherein a high etch-rate gas is added to the halogen-based gas and inert gas.

5. The method according to claim 4, wherein the high etch-rate gas is fluorine.

6. The method according to claim 2, wherein a polymer is formed on a sidewall of the recess of the semiconductor substrate during the etching when a HBr or CxHyFz gas is used to control etching of the sidewall, where x, y, and z is 0 or a positive integer and y or z is greater than x.

7. The method according to claim 1, wherein the pad oxide layer and the pad nitride layer are etched in order to expose an area of the semiconductor substrate using dry etching process using a CF based gas and an additive gas including gas selected from the list of $N_2$, $O_2$, and Ar.

8. The method according to claim 1, wherein the nitride film is formed using either a heat diffusion process or a high-speed annealing process on the nitrogen ion-implanted layer.

9. The method according to claim 8, wherein the heat diffusion process is performed at a temperature of between 500 and 900° C. for between 1 and 10 hours.

10. The method according to claim 1, wherein the nitride film is removed by performing a wet etching process using a phosphoric acid solution.

11. The method according to claim 10, wherein the rounded corner portion extends to an area of the semiconductor substrate below the pad oxide layer.

12. The method according to claim 1, wherein the buffer oxide layer is removed by performing a wet etching process using hydrofluoric acid.

* * * * *